(12) United States Patent
Lo et al.

(10) Patent No.: US 7,392,147 B2
(45) Date of Patent: Jun. 24, 2008

(54) USB PORT TESTER

(75) Inventors: Chien-Hung Lo, Tu-Cheng (TW); Tao-Gen Chen, Shenzhen (CN); Xiao Su, Shenzhen (CN); Min-Fu Deng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,707

(22) Filed: Sep. 15, 2006

(65) Prior Publication Data

US 2007/0136025 A1    Jun. 14, 2007

(30) Foreign Application Priority Data

Dec. 9, 2005    (CN) .......................... 2005 1 0102296

(51) Int. Cl.
*G01M 19/00* (2006.01)

(52) U.S. Cl. ............................ 702/122; 702/57; 702/58; 702/64; 702/65; 714/25

(58) Field of Classification Search .......... 702/121–124, 702/57, 58, 64, 65, 117; 710/305; 713/310; 714/25; 324/537, 763
See application file for complete search history.

(56) References Cited

U.S. PATENT DOCUMENTS 6,629,169 B2    9/2003   Chu
6,829,726 B1 *  12/2004  Korhonen ..................... 714/25

FOREIGN PATENT DOCUMENTS

CN    2168288 Y    6/1994
CN    1444151 A    9/2003

* cited by examiner

*Primary Examiner*—Hal Wachsman
*Assistant Examiner*—Phuong Huynh
(74) *Attorney, Agent, or Firm*—Wei Te Chung

(57) ABSTRACT

A Universal Serial Bus (USB) port tester for testing a USB port of an electronic device includes an interface unit, a current-testing unit, and a voltage-testing unit. The interface unit is used for electrically connecting with the USB port of the electronic device and a USB device. The current-testing unit is connected to the interface unit for testing quality of the USB port of the electronic device in a standard current range. The voltage-testing unit is connected to the interface unit for testing quality of the USB port of the electronic device in a standard voltage range.

18 Claims, 4 Drawing Sheets

USB PORT TESTER

FIELD OF THE INVENTION

The present invention relates to a tester for testing Universal Serial Bus (USB) ports of electronic devices.

DESCRIPTION OF RELATED ART

Today, Universal Serial Bus (USB) technology is broadly applied to serial communication solutions and becomes more and more important. Before selling or using electronic devices having USB ports, the USB ports need to be tested. A conventional method for testing the USB ports is using some conventional USB devices such as USB mouses, USB keyboards, USB hard disk drives, etc., to directly connect with the USB ports, and inspecting working status of the USB devices to judge whether the USB ports are good or not. However, this method requires plugging or unplugging the USB devices to or from the USB ports separately and frequently, which is unduly laborious and time-consuming. In addition, this method utilizes the USB mouses, USB keyboards, USB hard disk drives, etc. as the USB devices, which increase testing cost.

What is desired, therefore, is to provide a tester which can conveniently test USB ports of an electronic device.

SUMMARY OF THE INVENTION

An exemplary Universal Serial Bus (USB) port tester for testing a USB port of an electronic device includes an interface unit, a current-testing unit, and a voltage-testing unit. The interface unit is used for electrically connecting with the USB port of the electronic device and a USB device. The current-testing unit is connected to the interface unit for testing quality of the USB port of the electronic device in a standard current range. The voltage-testing unit is connected to the interface unit for testing quality of the USB port of the electronic device in a standard voltage range.

Other advantages and novel features will become more apparent from the following detailed description when taken in conjunction with the accompanying drawings, in which:

DETAILED DESCRIPTION OF THE INVENTION

Figure 1:
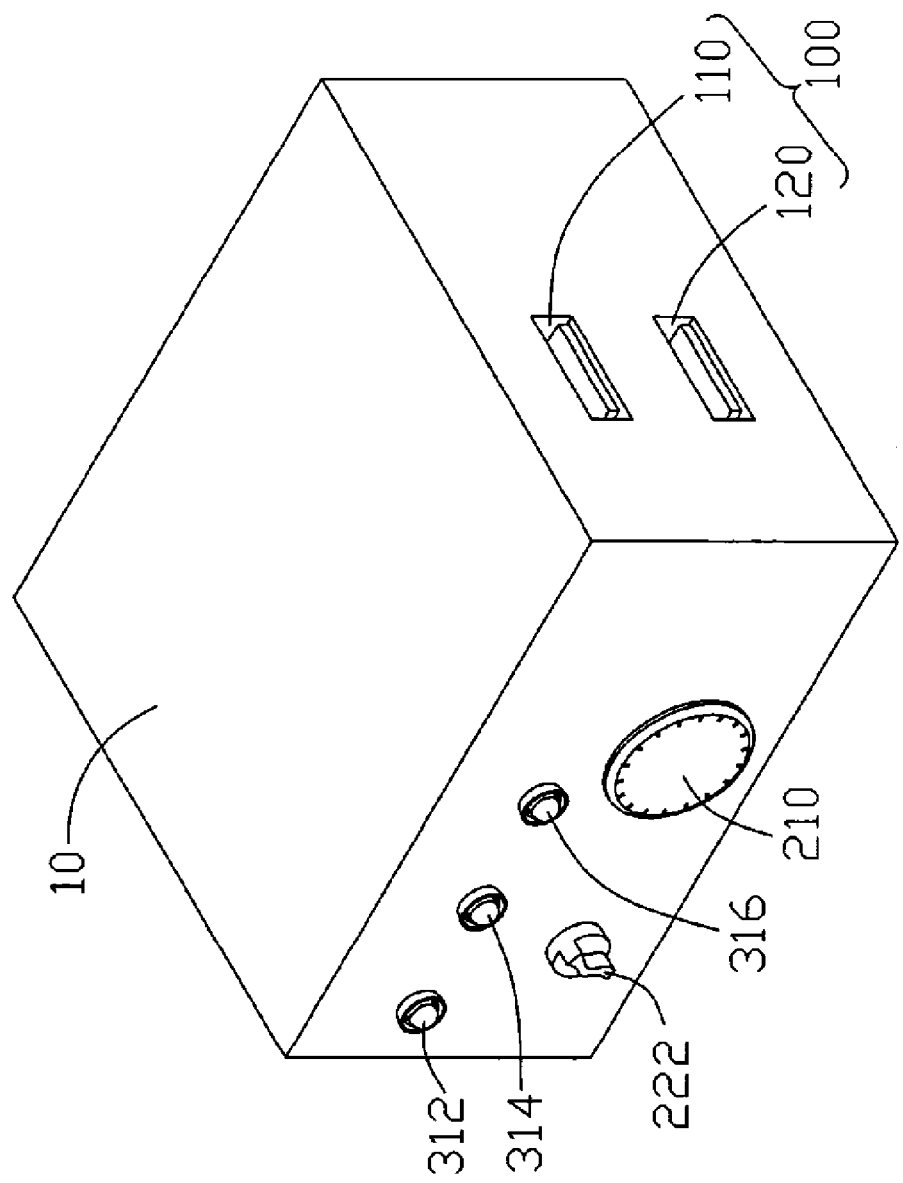
FIG. 1 is an isometric, schematic view of a USB port tester in accordance with a preferred embodiment of the present invention.
Figure 2:
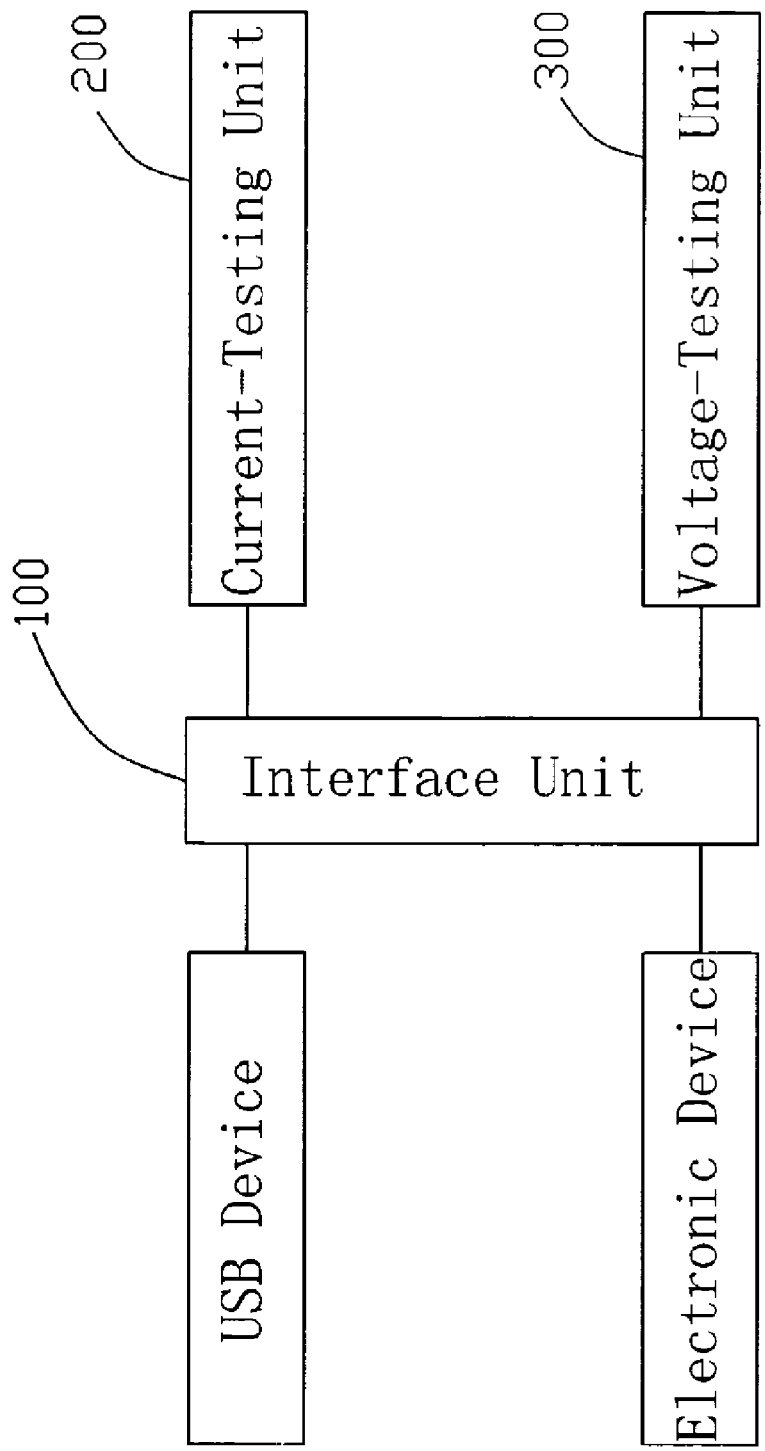
FIG. 2 is a block diagram of FIG. 1.
Figure 3:
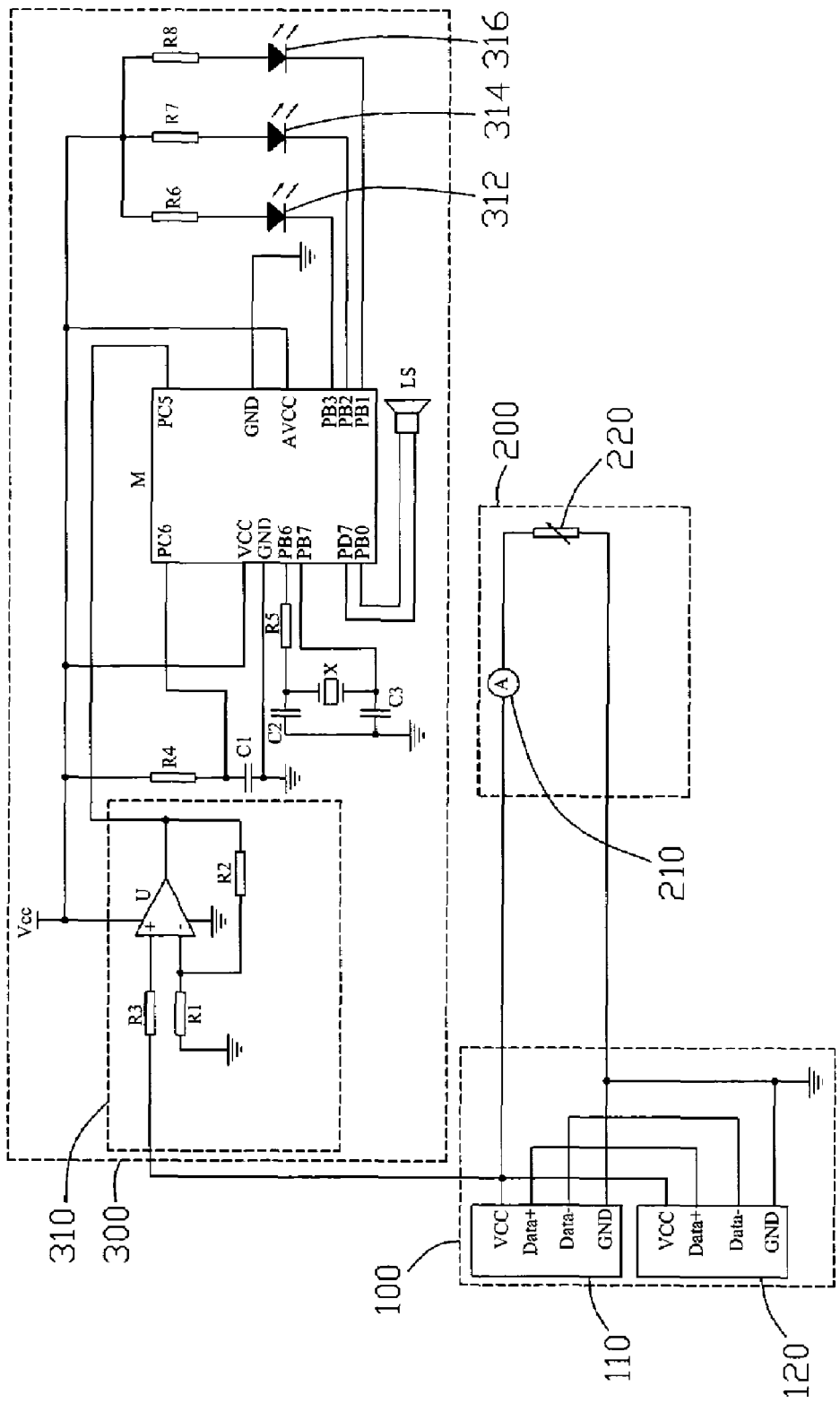
FIG. 3 is a circuit diagram of FIG. 1.

Referring to FIGS. 1 to 3, a Universal Serial Bus (USB) port tester in accordance with a preferred embodiment of the present invention is shown. The USB port tester includes a case 10, an interface unit 100, a current-testing unit 200, and a voltage-testing unit 300. The interface unit 100 includes a first USB port 110 and a second USB port 120. The current-testing unit 200 includes an ampere meter 210, a variable resistor 220, and an adjusting knob 222 for adjusting resistance of the variable resistor 220. The voltage-testing unit 300 includes a direct current (DC) power supply source Vcc, an amplifying circuit 310, a Microprogrammed Control Unit (MCU) M, and an indicating unit. The indicating unit includes a first indicator 312, a second indicator 314, a third indicator 316, and a buzzer LS. As shown, three light-emitting diodes (LEDs) are utilized as the first indicator 312, the second indicator 314, and the third indicator 316, respectively.

In this embodiment, the first USB port 110, the second USB port 120, the ampere meter 210, the adjusting knob 222, the first indicator 312, the second indicator 314, and the third indicator 316 are mounted on the case 10. The variable resistor 220, the DC power supply source Vcc, the MCU M, and the buzzer LS are installed in the case 10.

Terminals of the first USB port 110 are respectively electrically coupled to the corresponding terminals of the second USB port 120. The ampere meter 210 and the variable resistor 220 are connected between a power terminal VCC and a ground terminal GND of the first USB port 110 in series.

The MCU M is connected to the power terminal VCC of the first USB port 110 via the amplifying circuit 310. In this embodiment, the amplifying circuit 310 comprises an operational amplifier U, and three resistors R1, R2, and R3. Gain of the amplifying circuit 310 can be adjusted via choosing suitable resistances of the resistors R1, R2, and R3 according to need. The amplifying circuit 310 amplifies voltage of the first USB port 100, and the MCU M tests the amplified voltage. The first indicator 312, the second indicator 314, and the third indicator 316 are connected between the DC power supply source Vcc and the MCU M. The buzzer LS is connected with the MCU M. The MCU M is connected with a reset circuit that includes a resistor R4 and a capacitor C1, and a clock circuit that includes two capacitors C2 and C3, a resistor R5, and a crystal oscillator X.

The MCU M is programmed according to a standard of the USB port protocol. In this embodiment, the standard is: current range of the USB port is from 0 to 500 mA, and voltage range of the USB port is from 4.75V to 5.25V. If gain of the amplifying circuit 310 is one-hundred, the MCU M is programmed so that the MCU M tests voltage of the first USB port 110 via the amplifying circuit 310 and is supplied power by the DC power supply source Vcc, and the third indicator 316 will light up. If a voltage value of the first USB port 110 is greater than 5.25V, the first indicator 312 will light up and the buzzer LS activates. If the voltage value of the first USB port 110 is less than 4.75V, the second indicator 314 will light up and the buzzer LS activates. The MCU M also can be programmed according to other standards of the USB port protocol and other gains of the amplifying circuit 310.

Figure 4:
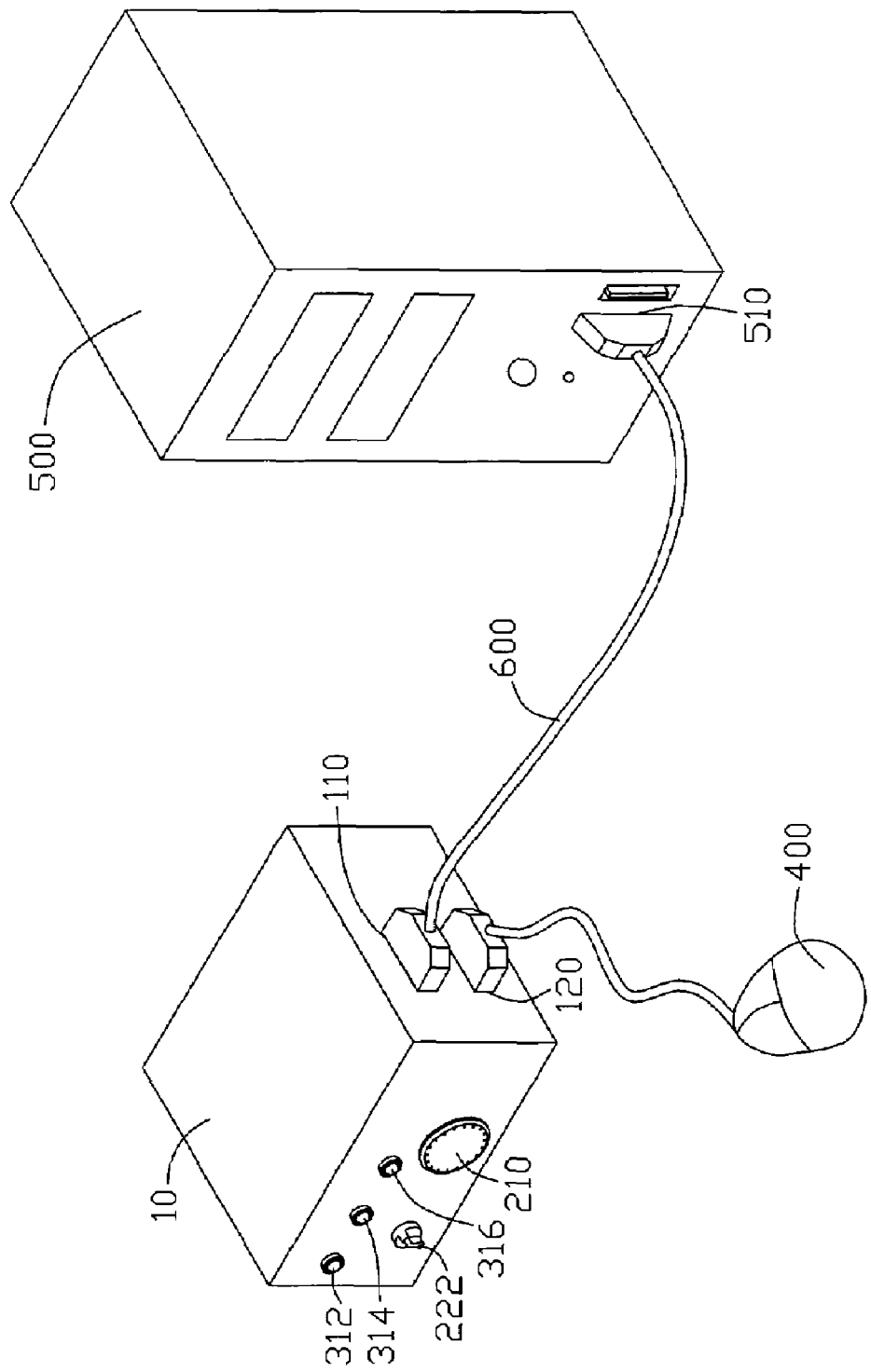
FIG. 4 is an isometric, schematic view of the USB port tester of FIG. 1 being used to test a USB port of a computer, together with a USB mouse.

Referring also to FIG. 4, when testing a USB port of an electronic device such as a computer 500, a good USB device such as a USB mouse 400 needs to be applied. Firstly, a USB port 510 to be tested of the computer 500 is connected to the first USB port 110 of the USB port tester via a USB adapter line 600. Secondly, the USB mouse 400 is connected to the second USB port 120 of the USB port tester, Thirdly, the DC power supply source Vcc is turned on, and the third indicator 316 lights up. Then, the resistance of the variable resistor 220 is adjusted via the adjusting knob 222 and the ampere meter 210 so that a current of the first USB port 110 is 500 mA. At this point, the USB mouse 400 is used and a display (not shown) of the computer 500 is watched, if the USB mouse 400 does not work well, the USB port 510 of the computer 500 is bad.

If the USB mouse 400 works well, but the first indicator 312 is turned on (the buzzer LS also alarms at the same time), a supply voltage of the USB port 510 is greater than the USB port standard, namely the USB port 510 is bad. If the second indicator 314 is turned on (the buzzer LS also alarms at the same time), the supply voltage of the USB port 510 is less than the USB port standard, also indicating the USB port 510 is bad. If the first indicator 312 and the second indicator 314 are unlit, that is the supply voltage of the USB port 510 satisfies the USB port standard, then the USB port 510 is good.

It is to be understood, however, that even though numerous characteristics and advantages of the preferred embodiments have been set forth in the foregoing description, together with details of the structures and functions of the embodiments, the disclosure is illustrative only, and changes may be made in detail, especially in matters of shape, size, equivalent material and arrangement of parts within the principles of the invention to the full extent indicated by the broad general meaning of the terms in which the appended claims are expressed.

What is claimed is:

1. A Universal Serial Bus (USB) port tester for testing a USB port of an electronic device, the USB port tester comprising:
    an interface unit configured for electrically connecting the USB port of the electronic device to a USB device, the interface unit comprising a first USB port for electrically connecting with the USB port of the electronic device, and a second USB port for electrically connecting with the USB device, terminals of the first USB port respectively electrically coupled to the corresponding terminals of the second USB port;
    a current-testing unit connected to the interface unit for testing quality of the USB port of the electronic device in a standard current range, the current-testing unit comprising an ampere meter and a variable resistor, the ampere meter and the variable resistor connected between a power terminal and a ground terminal of the first USB port in series; and
    a voltage-testing unit connected to the interface unit for testing quality of the USB port of the electronic device in a standard voltage range.

2. The USB port tester as claimed in claim 1, wherein the voltage-testing unit comprises a direct current (DC) power supply source, a Microprogrammed Control Unit (MCU), and an indicating unit, the DC power supply source is applied to the MCU, the MCU is connected to the power terminal of the first USB port, the indicating unit is connected to the MCU for indicating whether a voltage of the USB port of the electronic device is in the standard voltage range or not.

3. The USB port tester as claimed in claim 2, wherein the indicating unit comprises a first indicator, and a second indicator, the first indicator indicates whether a voltage of the USB port of the electronic device is greater than the standard voltage range or not, the second indicator indicates whether a voltage of the USB port of the electronic device is less than the standard voltage range or not.

4. The USB port tester as claimed in claim 2, wherein the indicating unit comprises a third indicator, the third indicator indicates the working status of the DC power supply source.

5. The USB port tester as claimed in claim 2, wherein the indicating unit comprises a buzzer, the buzzer is connected to the MCU for indicating whether voltage of the USB port of the electronic device satisfies a range of standard voltage or not.

6. The USB port tester as claimed in claim 2, wherein an amplifying circuit is connected between a power terminal of the first USB port and the MCU.

7. The USB port tester as claimed in claim 1, wherein the USB device is a USB mouse.

8. A Universal Serial Bus (USB) port tester for testing a USB port of an electronic device, the USB port tester comprising:
    an interface unit comprising a first USB port and a second USB port the first USB port configured for electrically connecting with the USB port of the electronic device;
    the second USB port electrically connected to a USB device, terminals of the first USB port respectively electrically coupled to the corresponding terminals of the second USB port;
    a current-testing unit connected to the interface unit for testing current of the USB port of the electronic device, the current-testing unit comprising an ampere meter and a variable resistor, the ampere meter and the variable resistor connected between a power terminal and a ground terminal of the first USB port in series; and
    a voltage-testing unit connected to the interface unit for testing voltage of the USB port of the electronic device.

9. The USB port tester as claimed in claim 8, wherein the voltage-testing unit comprises a direct current (DC) power supply source, a Microprogrammed Control Unit (MCU), and an indicating unit, the DC power supply source is applied to the MCU, the MCU is connected to the power terminal of the first USB port, the indicating unit is connected to the MCU for indicating whether a voltage of the USB port of the electronic device is in a standard voltage range or not.

10. The USB port tester as claimed in claim 9, wherein the indicating unit comprises a first indicator, and a second indicator, the first indicator indicates whether a voltage of the USB port of the electronic device is greater than the standard voltage range or not, the second indicator indicates whether a voltage of the USB port of the electronic device is less than the standard voltage range or not.

11. The USB port tester as claimed in claim 9, wherein the indicating unit comprises a third indicator, the third indicator indicates the working status of the DC power supply source.

12. The USB port tester as claimed in claim 9, wherein the indicating unit comprises a buzzer, the buzzer is connected to the MCU for indicating whether a voltage of the USB port of the electronic device is in the standard voltage range or not.

13. The USB port tester as claimed in claim 9, wherein an amplifying circuit is connected between the power terminal of the first USB port and the MCU.

14. A Universal Serial Bus (USB) port tester for testing a USB port of an electronic device, the USB port tester comprising:
    an interface unit comprising a first USB port and a second USB port the first USB port configured for electrically connecting with the USB port of the electronic device,
    the second USB port electrically connected to a USB device, terminals of the first USB port respectively electrically coupled to the corresponding terminals of the second USB port;
    a current-testing unit connected to the interface unit for testing current of the USB port of the electronic device; and
    a voltage-testing unit connected to the interface unit for testing voltage of the USB port of the electronic device, the voltage-testing unit comprises a direct current (DC) power supply source, a Microprogrammed Control Unit (MCU), and an indicating unit the DC power supply source is applied to the MCU, the MCU is connected to the power terminal of the first USB port, the indicating unit is connected to the MCU for indicating whether a voltage of the USB port of the electronic device is in a standard voltage range or not.

15. The USB port tester as claimed in claim 14, wherein the indicating unit comprises a first indicator, and a second indicator, the first indicator indicates whether a voltage of the USB port of the electronic device is greater than the standard voltage range or not, the second indicator indicates whether a voltage of the USB port of the electronic device is less than the standard voltage range or not.

16. The USB port tester as claimed in claim 14, wherein the indicating unit comprises a third indicator, the third indicator indicates the working status of the DC power supply source.

17. The USB port tester as claimed in claim 14, wherein the indicating unit comprises a buzzer, the buzzer is connected to the MCU for indicating whether a voltage of the USB port of the electronic device is in the standard voltage range or not.

18. The USB port tester as claimed in claim 14, wherein an amplifying circuit is connected between the power terminal of the first USB port and the MCU.

* * * * *